(12) United States Patent
Jenninger et al.

(10) Patent No.: US 8,941,284 B2
(45) Date of Patent: Jan. 27, 2015

(54) ELECTROMAGNETIC CONVERTER WITH A POLYMER ELEMENT BASED ON A MIXTURE OF POLYISOCYANATE AND ISOCYANATE-FUNCTIONAL PREPOLYMER AND A COMPOUND WITH AT LEAST TWO ISOCYANATE REACTIVE HYDROXYL GROUPS

(75) Inventors: Werner Jenninger, Köln (DE);
Sebastian Dörr, Düsseldorf (DE);
Joachim Wagner, Köln (DE)

(73) Assignee: Bayer MaterialScience AG, Leverkusen (DE)

( * ) Notice: Subject to any disclaimer, the term of this patent is extended or adjusted under 35 U.S.C. 154(b) by 563 days.

(21) Appl. No.: 13/387,413

(22) PCT Filed: Jul. 20, 2010

(86) PCT No.: PCT/EP2010/004435
§ 371 (c)(1),
(2), (4) Date: Feb. 21, 2012

(87) PCT Pub. No.: WO2011/012244
PCT Pub. Date: Feb. 3, 2011

(65) Prior Publication Data
US 2012/0194039 A1    Aug. 2, 2012

(30) Foreign Application Priority Data
Jul. 31, 2009  (EP) .................................... 09009911

(51) Int. Cl.
*H01L 41/09* (2006.01)
*H02N 11/00* (2006.01)
*C08G 18/10* (2006.01)
*H01L 41/193* (2006.01)
*H01L 41/45* (2013.01)

(52) U.S. Cl.
CPC .............. *C08G 18/10* (2013.01); *H01L 41/193* (2013.01); *H01L 41/45* (2013.01); *Y10S 310/80* (2013.01)

USPC ......................... 310/300; 310/800; 29/25.35

(58) Field of Classification Search
USPC .......................... 310/300, 365, 800; 29/25.35
See application file for complete search history.

(56) References Cited

U.S. PATENT DOCUMENTS

| | | | | |
|---|---|---|---|---|
| 5,047,162 A | * | 9/1991 | Krug et al. | 252/62.9 R |
| 5,977,685 A | * | 11/1999 | Kurita et al. | 310/311 |
| 6,847,153 B1 | * | 1/2005 | Balizer | 310/311 |
| 7,468,575 B2 | * | 12/2008 | Pelrine et al. | 310/363 |
| 7,911,115 B2 | * | 3/2011 | Pelrine et al. | 310/328 |
| 7,923,064 B2 | * | 4/2011 | Pelrine et al. | 427/171 |
| 8,163,492 B2 | * | 4/2012 | Unger et al. | 435/6.12 |
| 2011/0021916 A1 | * | 1/2011 | Morita | 600/443 |
| 2011/0133598 A1 | * | 6/2011 | Jenninger et al. | 310/311 |
| 2011/0198852 A1 | * | 8/2011 | Jenninger et al. | 290/53 |
| 2011/0298335 A1 | * | 12/2011 | Jenninger et al. | 310/338 |
| 2012/0194039 A1 | * | 8/2012 | Jenninger et al. | 310/365 |
| 2013/0307370 A1 | * | 11/2013 | Jenninger et al. | 310/300 |

FOREIGN PATENT DOCUMENTS

WO        0106575 A1    1/2001

* cited by examiner

*Primary Examiner* — Thomas Dougherty
(74) *Attorney, Agent, or Firm* — John E. Mrozinski, Jr.

(57) ABSTRACT

The present invention relates to an electromechanical converter, in particular an electromechanical sensor, actuator and/or generator, which comprises a polymer element obtainable from a reaction mixture comprising a polyisocyanate, a polyisocyanate prepolymer and a compound having at least two isocyanate-reactive hydroxy groups. The present invention additionally relates to a process for the production of such an electromechanical converter and to the use of a polymer element according to the invention as an electromechanical element. The present invention relates further to an electronic and/or electrical device comprising an electromechanical converter according to the invention and to the use of an electromechanical converter according to the invention in an electronic and/or electrical device.

16 Claims, No Drawings

US 8,941,284 B2

ELECTROMAGNETIC CONVERTER WITH A POLYMER ELEMENT BASED ON A MIXTURE OF POLYISOCYANATE AND ISOCYANATE-FUNCTIONAL PREPOLYMER AND A COMPOUND WITH AT LEAST TWO ISOCYANATE REACTIVE HYDROXYL GROUPS

FIELD OF THE INVENTION

The present invention relates to an electromechanical converter, in particular an electromechanical sensor, actuator and/or generator, which comprises a polymer element obtainable from a reaction mixture comprising a polyisocyanate and a polyisocyanate prepolymer and a compound having at least two isocyanate-reactive hydroxy groups. The present invention additionally relates to a process for the production of such an electromechanical converter and to the use of such a polymer element as an actuator, sensor and/or generator. The present invention relates further to an electronic and/or electrical device comprising an electromechanical converter according to the invention and to the use of an electromechanical converter according to the invention in an electronic and/or electrical device.

BACKGROUND OF THE INVENTION

An electromechanical converter converts electrical energy into mechanical energy and vice versa. Electromechanical converters can therefore be used as sensors, actuators and/or generators.

The fundamental structure of such a converter is based on a layer of an electroactive polymer, which is coated on both sides with electrodes. An electroactive polymer is understood as being a polymer which changes its volume and/or its shape in dependence on a voltage applied thereto and/or which is capable of generating a voltage through a change in volume and/or shape.

WO 01/06575 A1 discloses that silicone elastomers, acrylic elastomers, polyurethanes, thermoplastic elastomers, copolymers comprising polytetrafluoroethylene, fluorinated elastomers, and polymers comprising silicone and acrylic groups, for example, can exhibit such electromechanical properties. Unpublished European patent application EP08013648.4 discloses electromechanical converters which are produced from polyisocyanates and/or polyisocyanate prepolymers and diamino-functional compounds. Unpublished European patent application EP08018936.8 discloses electromechanical converters which are produced from solutions of at least one polyurethane in organic solvents. These systems have the disadvantage that, owing to the high content of organic solvents, there are only limited coating possibilities because various demands must be complied with in terms of health and safety, for example in order to protect workers and avoid ignition sources. For ecological reasons too, a system without large amounts of organic solvents is desirable.

Moreover, conventional polymers used in electromechanical converters frequently have disadvantageous properties which may adversely affect the functional capability of the electromechanical converters. These include poor mechanical and other properties, in particular disadvantageous elongation properties, a poor insulating action, in particular low breakthrough field strengths and high electrical conductivities, poor processability and high material costs. In particular, it is not possible to achieve a combination of the desired property features in one material using polymers, for example silicones, that are conventionally employed in electromechanical converters. Even the polyurethanes used in EP08013648.4 and EP08018936.8 to produce the converter exhibit less optimal mechanical properties because the polyurethanes are those having linear polymer chains, which in particular results in less optimal elastomeric properties.

DETAILED DESCRIPTION OF THE INVENTION

The present invention will now be described for purpose of illustration and not limitation. Except in the operating examples, or where otherwise indicated, all numbers expressing quantities, percentages, OH numbers, functionalities and so forth in the specification are to be understood as being modified in all instances by the term "about ". Equivalent weights and molecular weights given herein in Daltons (Da) are number average equivalent weights and number average molecular weights respectively, unless indicated otherwise.

It was an object of the present invention, therefore, to provide an electromechanical converter which exhibits improved properties and overcomes the disadvantages of known electromechanical converters.

Within the scope of the present invention it has been found that this object is achieved by an electromechanical converter that contains a polymer element obtainable from a reaction mixture comprising a polyisocyanate and a polyisocyanate prepolymer and a compound having at least two isocyanate-reactive hydroxy groups, in particular hydroxy-group-containing polymers. The definition of and distinction between the terms "polyisocyanate" and "polyisocyanate prepolymer" is given hereinbelow. It is in each case a compound containing at least two free isocyanate groups.

The present invention accordingly provides an electromechanical converter containing at least two electrodes and at least one electroactive polymer element, wherein the polymer element is arranged between two electrodes and in particular is in contact with at least one of the electrodes, and wherein the polymer element is obtainable, according to the invention, from a reaction mixture, for example a film-forming reaction mixture, comprising the following components A) a polyisocyanate
B) a polyisocyanate prepolymer
C) a compound having at least two isocyanate-reactive hydroxy groups.

According to the invention there are suitable as the polyisocyanate and component A), for example, 1,4-butylene diisocyanate, 1,6-hexamethylene diisocyanate (HDI), isophorone diisocyanate (IPDI), 2,2,4- and/or 2,4,4-trimethylhexamethylene diisocyanate, the isomeric bis-(4,4'-isocyanatocyclohexy)methanes or mixtures thereof having any desired isomer content, 1,4-cyclohexylene diisocyanate, 4-isocyanatomethyl-1,8-octane diisocyanate (nonane triisocyanate), 1,4-phenylene diisocyanate, 2,4- and/or 2,6-toluylene diisocyanate, 1,5-naphthylene diisocyanate, 2,2'- and/or 2,4'- and/or 4,4'-diphenylmethane diisocyanate, 1,3- and/or 1,4-bis-(2-isocyanatoprop-2-yl)-benzene (TMXDI), 1,3-bis(isocyanatomethyl)benzene (XDI), alkyl 2,6-diisocyanatohexanoate (lysine diisocyanate) containing alkyl groups having from 1 to 8 carbon atoms, and mixtures thereof. Suitable structural units of component A are also compounds based on the mentioned diisocyanates and containing a uretdione, isocyanurate, biuret, iminooxadiazinedione or oxadiazinetrione structure.

The polyisocyanate prepolymers which can be used as component B) can be obtained by reaction of one or more diisocyanates with one or more hydroxy-functional, in particular polymeric, polyols, optionally with the addition of catalysts as well as auxiliary substances and additives. Furthermore, components for chain extension, such as, for example, having primary and/or secondary amino groups (NH2- and/or NH-functional components) can additionally be used for forming the polyisocyanate prepolymer.

Within the scope of the present invention, component C) can in principle be a compound having at least two isocyanate-reactive hydroxy groups. For example, component C) can be a polyol having at least two isocyanate-reactive hydroxy groups.

Within the scope of the present invention, the term "a" in connection with components A), B) and C) is used not as a numeral but as the indefinite article.

The polymer element prepared from the components according to the invention has good mechanical strength and high elasticity. Furthermore, the polymer element additionally has good electrical properties, such as breakthrough field strength and dielectric constant, and can therefore advantageously be used in an electromechanical converter.

When a mechanical load is applied to such a converter, the converter is deformed, for example, along its thickness and a strong electrical signal can be detected at the electrodes. Mechanical energy is thereby converted into electrical energy. Consequently, the converter according to the invention can be used both as a generator and as a sensor.

Using the opposite effect, on the other hand, that is to say the conversion of electrical energy into mechanical energy, the converter according to the invention can equally be used as an actuator.

In an embodiment of the electromechanical converter according to the invention, component A) in the reaction mixture can be a diisocyanate-based polyisocyanate having a functionality ≥2 and having a uretdione, isocyanurate, biuret, iminooxadiazinedione or oxadiazinetrione structure or a mixture thereof, particular preference being given to those having an isocyanurate structure.

In an embodiment of the electromechanical converter according to the invention, component A) can be a polyisocyanate or a polyisocyanate mixture having a mean NCO functionality of from 2 to 4 and having solely aliphatically or cycloaliphatically bonded isocyanate groups. Preference is given to polyisocyanates or polyisocyanate mixtures of the above-mentioned type having a uretdione, isocyanurate, biuret, iminooxadiazinedione or oxadiazinetrione structure and mixtures thereof, and having a mean NCO functionality of the mixture of from 2 to 4, preferably from 2 to 2.6 and particularly preferably from 2 to 2.4.

There can particularly preferably be used as component A) polyisocyanates based on hexamethylene diisocyanate, isophorone diisocyanate or the isomeric bis-(4,4'-isocyanatocyclohexyl)methanes as well as mixtures of the above-mentioned diisocyanates.

The polyisocyanate prepolymer as component B) can preferably be obtainable from the reaction of polymeric polyols and aliphatic diisocyanates. Polyisocyanate prepolymers based on polypropylene glycol as the polyol and hexamethylene diisocyanate as the aliphatic diisocyanate are preferred as component B).

According to the invention, hydroxy-functional, polymeric polyols for the reaction to the polyisocyanate prepolymer B) can also be, for example, polyester polyols, polyacrylate polyols, polyurethane polyols, polycarbonate polyols, polyether polyols, polyester polyacrylate polyols, polyurethane polyacrylate polyols, polyurethane polyester polyols, polyurethane polyether polyols, polyurethane polycarbonate polyols and/or polyester polycarbonate polyols. These can be used individually or in arbitrary mixtures with one another for the preparation of the polyisocyanate prepolymer.

Suitable polyester polyols for the preparation of the polyisocyanate prepolymers B) can be polycondensation products of diols as well as optionally triols and tetraols and dicarboxylic acids as well as optionally tricarboxylic acids and tetracarboxylic acids or hydroxycarboxylic acids or lactones. Instead of the free polycarboxylic acids it is also possible to use for the preparation of the polyesters the corresponding polycarboxylic acid anhydrides or corresponding polycarboxylic acid esters of lower alcohols.

Examples of suitable diols are ethylene glycol, butylene glycol, diethylene glycol, triethylene glycol, polyalkylene glycols such as polyethylene glycol, also 1,2-propanediol, 1,3-propanediol, 1,3-butanediol, 1,4-butanediol, 1,6-hexanediol and isomers, neopentyl glycol or hydroxypivalic acid neopentyl glycol ester or mixtures thereof, preference being given to 1,6-hexanediol and isomers, 1,4-butanediol, neopentyl glycol and hydroxypivalic acid neopentyl glycol ester. In addition, polyols such as trimethylolpropane, glycerol, erythritol, pentaerythritol, trimethylolbenzene or trishydroxyethyl isocyanurate or mixtures thereof can also be used.

There can be used as dicarboxylic acids phthalic acid, isophthalic acid, terephthalic acid, tetrahydrophthalic acid, hexahydrophthalic acid, cyclohexanedicarboxylic acid, adipic acid, azelaic acid, sebacic acid, glutaric acid, tetrachlorophthalic acid, maleic acid, fumaric acid, itaconic acid, malonic acid, suberic acid, 2-methylsuccinic acid, 3,3-diethylglutaric acid and/or 2,2-dimethylsuccinic acid. The corresponding anhydrides can also be used as the acid source.

Provided the mean functionality of the polyol to be esterified is ≥2, monocarboxylic acids, such as benzoic acid and hexanecarboxylic acid, can additionally also be used concomitantly.

Preferred acids are aliphatic or aromatic acids of the above-mentioned type. Adipic acid, isophthalic acid and phthalic acid are particularly preferred.

Hydroxycarboxylic acids which can be used concomitantly as reactants in the preparation of a polyester polyol having terminal hydroxyl groups are, for example, hydroxycaproic acid, hydroxybutyric acid, hydroxydecanoic acid or hydroxystearic acid or mixtures thereof. Suitable lactones are caprolactone, butyrolactone or homologues or mixtures thereof. Caprolactone is preferred.

Hydroxyl-group-containing polycarbonates, for example polycarbonate polyols, preferably polycarbonate diols, can likewise be used for the preparation of the polyisocyanate prepolymers B). For example, these can have a number-average molecular weight $M_n$ of from 400 g/mol to 8000 g/mol, preferably from 600 g/mol to 3000 g/mol. They can be obtained by reaction of carbonic acid derivatives, such as diphenyl carbonate, dimethyl carbonate or phosgene, with polyols, preferably diols.

Examples of diols suitable for this purpose are ethylene glycol, 1,2- and 1,3-propanediol, 1,3- and 1,4-butanediol, 1,6-hexanediol, 1,8-octanediol, neopentyl glycol, 1,4-bishydroxymethylcyclohexane, 2-methyl-1,3-propanediol, 2,2,4-trimethyl-1,3-pentanediol, dipropylene glycol, polypropylene glycols, dibutylene glycol, polybutylene glycols, bisphenol A or lactone-modified diols of the above-mentioned type, or mixtures thereof.

The diol component preferably contains from 40 wt. % to 100 wt. % hexanediol, preferably 1,6-hexanediol, and/or hexanediol derivatives. Such hexanediol derivatives are based on hexanediol and can contain ester or ether groups in addition to terminal OH groups. Such derivatives are obtainable, for example, by reaction of hexanediol with excess caprolactone or by etherification of hexanediol with itself to give di- or tri-hexylene glycol. Within the scope of the present invention, the amount of these and other components is so chosen, in a known manner, that the total does not exceed 100 wt. %, in particular the total is 100 wt. %.

Hydroxyl-group-containing polycarbonates, in particular polycarbonate polyols, are preferably linear in structure.

Polyether polyols can likewise be used for the preparation of the polyisocyanate prepolymers B). There are suitable, for example, polytetramethylene glycol polyethers as are obtainable by polymerisation of tetrahydrofuran by means of cationic ring opening. Polyether polyols that are likewise suitable can be the addition products of styrene oxide, ethylene oxide, propylene oxide, butylene oxide and/or epichlorohydrin with di- or poly-functional starter molecules. There can be used as suitable starter molecules, for example, water, butyl diglycol, glycerol, diethylene glycol, trimethylolpropane, propylene glycol, sorbitol, ethylenediamine, triethanolamine or 1,4-butanediol, or mixtures thereof.

Preferred components for the preparation of the polyisocyanate prepolymers B) are polypropylene glycol, polytetramethylene glycol polyether and polycarbonate polyols or mixtures thereof, with polypropylene glycol being particularly preferred.

Polymeric polyols having a number-average molecular weight $M_n$ of from 400 g/mol to 8000 g/mol, preferably from 400 g/mol to 6000 g/mol and particularly preferably from 600 g/mol to 3000 g/mol, can be used. They preferably have an OH functionality of from 1.5 to 6, particularly preferably from 1.8 to 3, most particularly preferably from 1.9 to 2.1.

In addition to the mentioned polymeric polyols, short-chained polyols can also be used in the preparation of the polyisocyanate prepolymers B). For example, it is possible to use ethylene glycol, diethylene glycol, triethylene glycol, 1,2-propanediol, 1,3-propanediol, 1,4-butanediol, 1,3-butylene glycol, cyclohexanediol, 1,4-cyclohexanedimethanol, 1,6-hexanediol, neopentyl glycol, hydroquinone dihydroxyethyl ether, bisphenol A (2,2-bis(4-hydroxyphenyl)propane), hydrogenated bisphenol A (2,2-bis(4-hydroxycyclohexyl)propane), trimethylolpropane, trimethylolethane, glycerol or pentaerythritol or a mixture thereof.

Also suitable are ester diols of the mentioned molecular weight range, such as α-hydroxybutyl-ε-hydroxy-caproic acid ester, ω-hydroxyhexyl-γ-hydroxybutyric acid ester, adipic acid (β-hydroxyethyl) ester or terephthalic acid bis(β-hydroxyethyl) ester.

Furthermore, monofunctional isocyanate-reactive hydroxyl-group-containing compounds can also be used for the preparation of the polyisocyanate prepolymers B). Examples of such monofunctional compounds are ethanol, n-butanol, ethylene glycol monobutyl ether, diethylene glycol monomethyl ether, diethylene glycol monobutyl ether, propylene glycol monomethyl ether, dipropylene glycol monomethyl ether, tripropylene glycol monomethyl ether, dipropylene glycol monopropyl ether, propylene glycol monobutyl ether, dipropylene glycol monobutyl ether, tripropylene glycol monobutyl ether, 2-ethylhexanol, 1-octanol, 1-dodecanol or 1-hexadecanol or mixtures thereof.

For the preparation of the polyisocyanate prepolymers B), it is possible in an embodiment of the invention to react diisocyanates with the polyols at a ratio of isocyanate groups to hydroxyl groups (NCO/OH ratio) of from 2:1 to 20:1, for example 8:1. Urethane and/or allophanate structures can thereby be formed. An amount of unreacted polyisocyanates can subsequently be separated off. Thin-layer distillation, for example, can be used for this purpose, there being obtained products that are low in residual monomers with residual monomer contents of, for example, ≤1 wt. %, preferably ≤0.5 wt. %, particularly preferably ≤0.1 wt. %. The reaction temperature can be from 20° C. to 120° C., preferably from 60° C. to 100° C. Stabilisers such as benzoyl chloride, isophthaloyl chloride, dibutyl phosphate, 3-chloropropionic acid or methyl tosylate can optionally be added during the preparation.

Furthermore, $NH_2$- and/or NH-functional components can additionally be used for chain extension in the preparation of the polyisocyanate prepolymers B).

Components that are suitable according to the invention for chain extension are organic diamines or polyamines. For example, it is possible to use ethylenediamine, 1,2-diaminopropane, 1,3-diaminopropane, 1,4-diaminobutane, 1,6-diaminohexane, isophoronediamine, isomeric mixture of 2,2,4- and 2,4,4-trimethylhexamethylenediamine, 2-methylpentamethylenediamine, diethylenetriamine, diaminodicyclohexylmethane or dimethylethylenediamine or mixtures thereof.

In addition, compounds that contain secondary amino groups in addition to a primary amino group or OH groups in addition to an amino group (primary or secondary) can also be used for the preparation of the polyisocyanate prepolymers B). Examples thereof are primary/secondary amines, such as diethanolamine, 3-amino-1-methylaminopropane, 3-amino-1-ethylaminopropane, 3-amino-1 -cyclohexylaminopropane, 3-amino-1-methylaminobutane, alkanolamines such as N-aminoethylethanolamine, ethanolamine, 3-aminopropanol, neopentanolamine. For chain termination there are conventionally used amines having a group that is reactive towards isocyanates, such as methylamine, ethylamine, propylamine, butylamine, octylamine, laurylamine, stearylamine, isononyloxypropylamine, dimethylamine, diethylamine, dipropylamine, dibutylamine, N-methylaminopropylamine, diethyl(methyl)aminopropylamine, morpholine, piperidine, or suitable substituted derivatives thereof, amide-amines of diprimary amines and monocarboxylic acids, monoketime of diprimary amines, primary/tertiary amines, such as N,N-dimethylaminopropylamine.

The polyisocyanate prepolymers used according to the invention as component B), or mixtures thereof, can preferably have a mean NCO functionality of from 1.8 to 5, particularly preferably from 2 to 3.5 and most particularly preferably from 2 to 2.5.

According to the invention, components A) and B) can preferably first be mixed with one another, and then the mixture of A) and B) can be reacted with C).

In a further embodiment, component C) can be a polyamine or a polyol having at least two isocyanate-reactive hydroxy groups. A polymeric polyol can preferably be used as component C). It is further preferred according to the invention for component C) to be a polymer having from 2 to 4 hydroxy groups, most particularly preferably a polypropylene glycol having from 2 to 3 hydroxy groups.

According to the invention there can be used as component C) hydroxy-functional, in particular polymeric, polyols, for example polyether polyols. There are suitable, for example, polytetramethylene glycol polyethers, as are obtainable by polymerisation of tetrahydrofuran by means of cationic ring opening. Polyether polyols that are likewise suitable can be the addition products of styrene oxide, ethylene oxide, propylene oxide, butylene oxide and/or epichlorohydrin with di- or poly-functional starter molecules. Suitable starter molecules which can be used are, for example, water, butyl diglycol, glycerol, diethylene glycol, trimethylolpropane, propylene glycol, sorbitol, ethylenediamine, triethanolamine or 1,4-butanediol or mixtures thereof.

It is preferred according to the invention for the polymeric polyols from C) to have a particularly narrow molecular weight distribution, i.e. a polydispersity (PD =Mw/Mn) of from 1.0 to 1.5, and/or an OH functionality greater than 1.9. Preferably, the mentioned polyether polyols have a polydispersity of from 1.0 to 1.5 and an OH functionality greater than 1.9, particularly preferably greater than or equal to 1.95.

Such polyether polyols can be prepared in a manner known per se by alkoxylation of suitable starter molecules, in particular using double metal cyanide catalysts (DMC catalysis). This method is described, for example, in patent specification U.S. Pat. No. 5,158,922 and Offenlegungsschrift EP 0 654 302 A1.

The reaction mixture according to the invention for the polymer element can be obtained by mixing components A), B) and C). The ratio of isocyanate-reactive hydroxy groups to free isocyanate groups is preferably from 1:1.5 to 1.5:1, particularly preferably from 1:1.02 to 1:0.95.

Preferably, at least one of components A), B) or C) has a functionality of ≥2.0, preferably of ≥2.5, preferably of ≥3.0, in order to introduce branching or crosslinking into the polymer element. Functionality refers in the case of components A and B to the mean number of NCO groups per molecule or in the case of component C to the mean number of OH groups per molecule. This branching or crosslinking brings about better mechanical properties and better elastomeric properties, in particular also better elongation properties, for the intended use as an electromechanical converter.

Within the scope of the present invention, the polymer element can be a polymer layer, in particular a polymer film, a polymer foil or a polymer coating. For example, the polymer layer can have a layer thickness of from 0.1 µm to 1500 µm, for example from 1 pm to 500 µm, in particular from 5 µm to 200 µm, preferably from 10 pm to 100 µm.

The polymer element according to the invention can advantageously have good mechanical strength and high elasticity. In particular, the polymer element according to the invention can have a maximum tension of ≥0.2 MPa, in particular from 0.4 MPa to 50 MPa, and a maximum elongation of ≥250%, in particular ≥350%. In addition, the polymer element according to the invention can have a tension of from 0.1 MPa to 1 MPa, for example from 0.1 MPa to 0.8 MPa, in particular from 0.1 MPa to 0.3 MPa, in the in-use elongation range of from 100% to 200% (determined according to DIN 53504). Furthermore, the polymer element according to the invention can have a module of elasticity of from 0.1 MPa to 10 MPa, for example from 0.2 MPa to 5 MPa, at 100% elongation (determined according to DIN EN 150 672 1-1).

Furthermore, the polymer element according to the invention can advantageously have good electrical properties; these can be determined according to ASTM D 149 for the breakthrough field strength and according to ASTM D 150 for the measurements of the dielectric constant.

The present invention further provides a process for the production of an electromechanical converter according to the invention, in which
at least two electrodes are prepared, and
a polymer element is prepared by reaction of a reaction mixture comprising the following components
A) a polyisocyanate
B) a polyisocyanate prepolymer and
C) a compound having at least two isocyanate-reactive hydroxy groups,
and
the polymer element is arranged between two electrodes.

In particular, the polymer element can be so arranged between two electrodes that the polymer element is in contact with at least one of the electrodes.

Within the scope of an embodiment of the present invention, the electroactive polymer element can be so arranged between two electrodes that the electrodes on opposite sides of the polymer element adjoin the polymer element. For example, the polymer element can be coated on both sides with electrodes.

Within the scope of a preferred embodiment of the process according to the invention, the polymer element can be prepared by application of the reaction mixture to at least one of the electrodes and reaction of the reaction mixture. The reaction mixture can be applied, for example, by knife application, coating, pouring, spin coating, spraying or extrusion. It is likewise possible within the scope of the present invention to prepare the electrodes and the polymer element in separate steps and subsequently join them together.

Within the scope of a preferred embodiment of the process according to the invention, the reaction mixture is dried and/or tempered. Drying can take place in a temperature range of from 0° C. to 200° C., for example for from 0.1 minute to 48 hours, in particular for from 6 hours to 18 hours. Tempering can take place, for example, in a temperature range of from 80° C. to 250° C., for example for from 0.1 minute to 24 hours.

In an embodiment of the process according to the invention, the equivalent ratio of the isocyanate groups from A) to the isocyanate groups from B) that is used can be from ≥1:10 to ≤10:1, particularly preferably from ≥1:5 to ≤5:1 and most particularly preferably from ≥1:3 to ≤5 3:1. With such a chosen ratio for the reaction mixture, the polymer element prepared therewith can have particularly advantageous mechanical and electrical properties.

The rate, at 23° C., until substantial crosslinking and curing of the mixture of A), B) and C) is achieved can typically be from 1 second to 300 minutes, preferably from 1 minute to 20 minutes, particularly preferably from 1 minute to 10 minutes. Curing can be accelerated by means of catalysts. In a preferred embodiment, ≥50 mol % of the isocyanate-reactive groups for curing components A) and B) are polyether polyols. Within the scope of a particularly preferred embodiment of the present invention, components A) and B) are cured solely with polyether polyols and most particularly preferably solely with polypropylene glycol.

Preferred amounts by weight, based on the finished reaction mixture of A), B), C) and optionally further components, are:
from 1 to 30 parts by weight A), preferably from 4 to 20 parts by weight,
from 1 to 50 parts by weight B), preferably from 25 to 40 parts by weight,
from 10 to 70 parts by weight C), preferably from 30 to 65 parts by weight, and optionally
from 0 to 50 parts by weight of further auxiliary substances, added ingredients or additives, preferably from 0 to 20 parts by weight. The above-mentioned parts are in each case to be such that the sum of all the parts by weight is 100.

The reaction mixture comprising components A), B) and C) can on the one hand be applied directly to the electrodes and can cure thereon. On the other hand it is possible first to prepare a film or foil from the reaction mixture, which film or foil is optionally cured fully and then combined with the electrodes. Adhesives can be used thereby, or the adhesiveness of the reaction mixture itself can be utilised.

The film-forming reaction mixtures according to the invention can be applied by any application methods known per se; mention may be made of, for example, knife application, coating, pouring, spin coating, spraying or extrusion.

In addition to components A), B) and C), the reaction mixture can additionally also comprise auxiliary substances and additives. Examples of such auxiliary substances and additives are crosslinkers, thickeners, cosolvents, thixotropic agents, stabilisers, antioxidants, light stabilisers, emulsifiers, surfactants, adhesives, plasticisers, hydrophobing agents, pigments, fillers and flow improvers.

In addition to components A), B) and C), the reaction mixture can additionally also comprise fillers. The fillers can regulate the dielectric constant of the polymer element, for example. The reaction mixture preferably comprises fillers for increasing the dielectric constant, such as fillers having a high dielectric constant. Examples thereof are ceramics fillers, in particular barium titanate, titanium dioxide and piezoelectric ceramics such as quartz or lead zirconium titanate, as well as organic fillers, in particular those having a high electrical polarisability, for example phthalocyanines.

In addition, a high dielectric constant can also be achieved by incorporating electrically conductive fillers below the percolation threshold. Examples thereof are carbon black, graphite, single-wall or multi-wall carbon nanotubes, electrically conductive polymers such as polythiophenes, polyanilines or polypyrroles, or mixtures thereof. Of particular interest in this connection are those carbon black types which exhibit surface passivation and therefore, at low concentrations below the percolation threshold, increase the dielectric constant and nevertheless do not result in an increase in the conductivity of the polymer.

Within the scope of the present invention, additives for increasing the dielectric constant and/or the electrical breakthrough field strength can also be added after film formation. This can be effected, for example, by producing one or more further layers or by causing the additives to penetrate the polymer element, for example by diffusing them into the polymer element.

A multi-layer application of the reaction mixture, optionally with intermediate drying steps, is additionally also possible.

Drying and fixing of the reaction mixture can take place at temperatures of 30° C., preferably from 10° C. to 200° C. A coated substrate can thereby be guided over a heated surface, for example a roller. Application and drying can each be carried out discontinuously or continuously. The process as a whole is preferably continuous.

The polymer element according to the invention can be provided with further functional layers, for example conductive layers, barrier layers against solvents and gases, and/or adhesive layers. This can be carried out on one side or on both sides, in one layer or in a plurality of superposed layers, by coating the entire surface or part of the surface of the polymer element.

Suitable substrate materials for the preparation of a polymer film from the reaction mixture are in particular glass, release paper, foils and plastics, from which the polymer film produced can optionally be removed in a simple manner.

Processing of the individual layers of the reaction mixture can be carried out by pouring or by knife application carried out manually or by machine. Printing, screen printing, spraying and dipping are likewise possible processing techniques.

After crosslinking, a polymer element according to the invention in the form of a polymer film, polymer foil or polymer coating can have a layer thickness of from 0.1 µm to 1500 µm, for example from 1 µm to 500 µm, in particular from 5 µm to 200 µm, preferably from 10 µm to 100 µm.

The present invention further provides the use of a polymer element, obtainable from a reaction mixture comprising the following components
A) a polyisocyanaate
B) a polyisocyanate prepolymer and
C) a compound having at least two isocyanate-reactive hydroxy groups, as an electromechanical element, for example as a sensor, actuator and/or generator, in particular as an electromechanical element in a sensor, actuator and/or generator.

The present invention further provides an electronic and/or electrical device, in particular a structural component, automatic machine, instrument or component, comprising an electromechanical converter according to the invention.

The present invention further provides the use of an electromechanical converter according to the invention in an electronic and/or electrical device, in particular in an actuator, sensor and/or generator. Advantageously, the invention can be implemented in a large number of very varied applications in the electromechanical and electroacoustic field, in particular in the field of obtaining energy from mechanical vibrations (energy harvesting), acoustics, ultrasound, medical diagnostics, acoustic microscopy, mechanical sensor systems, in particular pressure, force and/or strain sensor systems, robotics and/or communications technology. Typical examples thereof are pressure sensors, electroacoustic converters, microphones, loudspeakers, vibration transducers, light deflectors, membranes, modulators for fibre optics, pyroelectric detectors, capacitors and control systems and "intelligent" floors, as well as systems for converting water-wave energy, in particular ocean wave energy, into electrical energy.

In order to construct a converter according to the invention, the polymer elements according to the invention can be coated on both sides with electrodes, as described, for example, in WO 01/06575. This fundamental structure can advantageously be used in a wide variety of configurations to produce sensors, actuators and/or generators. Advantageously, the polymer elements for the electromechanical converters according to the invention have particularly good mechanical and electrical properties. The electromechanical converters according to the invention can be used in many different applications.

The invention is to be explained further by means of the examples given below, without being limited thereto.

EXAMPLES

Unless indicated otherwise, all percentages are by weight.
Unless indicated otherwise, all analytical measurements are based on temperatures of 23° C.
Unless indicated expressly to the contrary, NCO contents were determined volumetrically according to DIN-EN ISO 11909.

The indicated viscosities were determined by means of rotary viscosimetry according to DIN 53019 at 23° C. using a rotary viscometer from Anton Paar Germany GmbH, Germany, Helmuth-Hirth-Str. 6, 73760 Ostfildern.

The incorporation of fillers into the dispersions according to the invention was carried out using a Specdmixer (model 150 FV from Hauschild & Co. KG, Germany, Waterkamp 1, 59075 Hamm).

Film layer thicknesses were measured using a mechanical touch probe from Dr. Johannes Heidenhain GmbH, Germany, Dr.-Johannes-Heidenhain-Str. 5, 83301 Traunreut. The test specimens were measured in three different places and the mean value was used as the representative measured value.

The tensile tests were carried out according to DIN 53 504 by means of a tensile testing machine from Zwick, model number 1455, equipped with a load cell for the total measuring range of 1 kN, at a traction speed of 50 mm/minute. S2 tensile rods were used as test specimens. Each measurement was carried out on three test specimens prepared in the same manner, and the mean value of the resulting data was used for the evaluation. Especially to this end, the tension in [MPa] at 100% and 200% elongation was also determined in addition to the tensile strength in [MPa] and the ultimate elongation in [%].

The permanent elongation was determined by means of a Zwicki tensile testing machine from Zwick/Roell, equipped with a load cell for the total measuring range of 50 N, on an S2 rod of the sample to be tested. In this measurement, the sample is stretched at a rate of 50 mm/minute to n* 50%; when this deformation has been reached, the sample is relieved to force=0 N and then the elongation that remains is determined. The next measuring cycle starts immediately thereafter with n=n+1; the value for n is increased until the sample tears. Only the value for 50% deformation is measured here.

The creep is likewise determined on the Zwicki tensile testing machine; the instrumentation corresponds to the test for determining the permanent elongation. The test specimen used in this case is a sample in strip form of dimensions 60×10 mm$^2$, which is clamped with a clamp spacing of 50 mm. After very rapid deformation to 55 mm, this deformation is kept constant for a period of 30 minutes and the force progression is determined during that time. The creep after 30 minutes is the percentage decrease in the force, based on the initial value immediately after deformation to 55 mm.

Measurements of the dielectric constant according to ASTM D 150-98 were conducted using a measuring system from Novocontrol Technologies GmbH & Co. KG, Obererbacher Straße 9, 56414 Hundsangen, Germany (measuring bridge: Alpha-A Analyzer, measuring head: ZGS Active Sample Cell Test Interface) with a test specimen diameter of 20 mm. A frequency range from $10^7$ Hz to $10^{-2}$ Hz was tested. The real component of the dielectric constant at $10^{-2}$ Hz was chosen as the measure of the dielectric constant of the tested material.

The breakthrough field strength according to ASTM D 149-97a was determined using a high-voltage source model LNC 20000-3pos from Heinzinger, Anton-Jakob-Str. 4, 83026 Rosenheim, Germany and a sample holder constructed internally at the DKI (Deutsches Kunststoffinstitut, Schloß-gartenstr. 6, 64289 Darmstadt, Germany). The sample holder contacts the polymer samples of homogeneous thickness with only a small mechanical preload and prevents the user from coming into contact with the voltage. In this system, the polymer film, without preloading, is subjected statically to an increasing voltage—in silicone oil in order to insulate against disruptive discharges in the air—until an electrical breakthrough occurs through the foil. The measurement result is the voltage reached at breakthrough, based on the thickness of the polymer film in [V/μm].

Substances and abbreviations used:

Desmodur® N 3300: Isocyanurate based on hexamethylene diisocyanate, NCO content 21.8±0.3% (according to DIN EN ISO 11 909), viscosity at 23° C. 3000±750 mPa·s, Bayer Material Science A G, Leverkusen, D E, (component A)

Desmodur® XP 2410 Low-viscosity, aliphatic polyisocyanate resin based on hexamethylene diisocyanate, NCO content 23.5±0.5 wt. % (DIN EN ISO 11 909) viscosity at 23° C. 730±100 mPa·s, Bayer Material Science AG, Leverkusen, DE, (component A)

Desmodur® XP 2599 Aliphatic, ether-group-containing prepolymer based on hexamethylene-1,6-diisocyanate (HDI), isocyanate content 6±0.5% (DIN EN ISO 11 909), viscosity at 23° C. 2500±500 mPa·s, Bayer MaterialScience AG, Leverkusen, DE, (component B)

DBTDL Dibutyltin dilaurate from E-Merck KGaA, Frankfurter Str. 250, D-64293 Darmstadt, Germany Example 1

Preparation of a diisocyanate-functional polyisocyanate prepolymer as component B)

1300 g of hexamethylene-1,6-diisocyanate (HDI), 1.3 g of benzoyl chloride and 1.3 g of para-toluenesulfonic acid methyl ester were placed in a 4-litre four-necked flask, with stirring. In the course of 3 hours, 1456 g of a difunctional polypropylene glycol polyether having a number-average molecular weight of 2000 g/mol were added at 80° C., and stirring was then carried out for one hour at the same temperature. The excess HDI was then distilled off by thin-layer distillation at 130° C. and 0.1 torr; 1 g of chloropropionic acid was found in the receiver. The resulting NCO prepolymer had an NCO content of 3.23% and a viscosity of 1650 mPas (25° C.).

Comparison Example C1

Preparation of a Polymer Element Not According to the Invention

The raw materials used were not degassed separately. 10 g of Desmodur XP 2599 (component B) were mixed with 28.1 g of a trifunctional polypropylene glycol-polyethylene glycol polyether having a number-average molecular weight of 6000 g/mol and an ethylene oxide unit content of 0 wt. % (component C) and with 0.028 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Comparison Example C2

Preparation of a Polymer Element Not According to the Invention

The raw materials used were not degassed separately. 10 g of Desmodur XP 2599 (component B) were mixed with 28.06 g of a difunctional polypropylene glycol-polyethylene glycol polyether having a number-average molecular weight of 4000 g/mol and an ethylene oxide unit content of 0 wt. % (component C) and with 0.028 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Comparison Example C3

Preparation of a polymer element not according to the invention

The raw materials used were not degassed separately. 3.91 g of Desmodur N3300 (component A) were mixed with 39.88 g of a difunctional polypropylene glycol-polyethylene glycol polyether having a number-average molecular weight of 4000 g/mol and an ethylene oxide unit content of 0 wt. % (component C) and with 0.12 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Comparison Example C4

Preparation of a Polymer Element Not According to the Invention

The raw materials used were not degassed separately. 3.58 g of Desmodur XP2410 (component A) were mixed with 39.88 g of a trifunctional polypropylene glycol-polyethylene glycol polyether having a number-average molecular weight of 6000 g/mol and an ethylene oxide unit content of 0 wt. % (component C) and with 0.12 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Comparison Example C5

Preparation of a polymer element not according to the invention

The raw materials used were not degassed separately. 3.91 g of Desmodur N3300 (component A) were mixed with 39.88 g of a trifunctional polypropylene glycol-polyethylene glycol polyether having a number-average molecular weight of 6000 g/mol and an ethylene oxide unit content of 0 wt. % (component C) and with 0.12 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Comparison Example C6

Preparation of a Polymer Element Not According to the Invention

The raw materials used were not degassed separately. 10.0 g of prepolymer from Example 1 (component B) were mixed with 39.88 g of a difunctional polypropylene glycol-polyethylene glycol polyether having a number-average molecular weight of 4000 g/mol and an ethylene oxide unit content of 0 wt. % (component C) and with 0.03 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. It was not possible to produce test specimens from this formulation.

Example E1 According to the Invention

Preparation of a Polymer Element According to the Invention

The raw materials used were not degassed separately. 3.0 g of Desmodur N 3300 (isocyanurate based on HDI, component A) and 7.0 g of the prepolymer from Example 1 (component B) were weighed into a polypropylene beaker and mixed with one another for one minute in a Speedmixer at 3000 revolutions per minute. This mixture was then mixed with 41.2 g of a difunctional polypropylene glycol-polyethylene glycol polyether having a number-average molecular weight of 4000 g/mol and an ethylene oxide unit content of 0 wt. % (component C) with an amount of 0.041 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Example E2 According to the Invention

Preparation of a Polymer Element According to the Invention

The raw materials used were not degassed separately. 3.0 g of Desmodur N 3300 (isocyanurate based on HDI, component A) and 7.0 g of the prepolymer from Example 1 (component B) were weighed into a polypropylene beaker and mixed with one another for one minute in a Speedmixer at 3000 revolutions per minute. This mixture was then mixed with 41.2 g of a trifunctional polypropylene glycol-polyethylene glycol polyether having a number-average molecular weight of 6000 g/mol and an ethylene oxide unit content of 0 wt. % (component C) with an amount of 0.041 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Example E3 according to the invention

Preparation of a Polymer Element According to the Invention

The raw materials used were not degassed separately. 4.0 g of Desmodur N 3300 (isocyanurate based on HDI, component A) and 16.0 g of the prepolymer from Example 1 (component B) were weighed into a polypropylene beaker and mixed with one another for one minute in a Speedmixer at 3000 revolutions per minute. This mixture was then mixed with 66.16 g of a difunctional polypropylene glycol-polyethylene glycol polyether having a number-average molecular weight of 4000 g/mol and an ethylene oxide unit content of 20 wt. %, based on the polyether, with an amount of 0.132 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

Example E4 According to the Invention

Preparation of a Polymer Element According to the Invention

The raw materials used were not degassed separately. 1.0 g of Desmodur N 3300 (isocyanurate based on HDI, component A) and 9.0 g of the prepolymer from Example 1 (component B) were weighed into a polypropylene beaker and mixed with one another for one minute in a Speedmixer at 3000 revolutions per minute. This mixture was then mixed with 24.22 g of a difunctional polypropylene glycol-polyethylene glycol polyether having a number-average molecular weight of 4000 g/mol and an ethylene oxide unit content of 20 wt. %, based on the polyether, with an amount of 0.048 g of DBTDL in a polypropylene beaker in a Speedmixer at 3000 revolutions per minute for a period of 3 minutes. From the still liquid reaction mixture, films having a wet layer thickness of 1 mm were applied manually to glass plates by means of a knife. After preparation, all the films were dried overnight at 80° C. in a drying cabinet and then tempered for 5 minutes at 120° C. The films could easily be detached from the glass plate by hand after tempering.

The samples were subjected to various measurements. The results for the examples not according to the invention and for the examples of polymer elements according to the invention are shown in Table 1 below.

TABLE 1

Properties of the films prepared in Examples C1 to C5 and E1 to E4

| Example | Ultimate elongation [%] | Tensile strength [MPa] | Modulus at 50% elongation [MPa] | Permanent elongation at 50% elongation [MPa] | Creep after 30 min [%] | Dielectric constant | Breakthrough field strength (state without elongation) [V/µm]] |
|---|---|---|---|---|---|---|---|
| C1 | 107 | 0.327 | 0.275 | 0.32 | 13.5 | 25 | 20.4 |
| C2 | 125 | 0.178 | 0.134 | 0.45 | 13.9 | 16.6 | 21.3 |
| C3 | 262 | 0.28 | 0.099 | 1.71 | 30.3 | 8.6 | 25 |
| C4 | 85 | 0.63 | 0.625 | 0.65 | 10.5 | 29 | 25.4 |
| C5 | 110 | 0.70 | 0.60 | −0.24 | 6.2 | 10.8 | 33.4 |
| E1* | 364 | 0.143 | 0.040 | 1.84 | 21.3 | 8.7 | 24.6 |
| E2* | 251 | 0.392 | 0.161 | 1.76 | 20.4 | 11.6 | 18.2 |
| E3* | 211 | 0.927 | 0.497 | 1.29 | 4.7 | 2800 | 35.5 |
| E4* | 516 | 1.085 | 0.266 | 2.48 | 19.9 | 1796 | 38.6 |

*according to the invention

It was shown in the tests that the polymer elements according to the invention in the form of films offer marked advantages over the prior art. Particular disadvantages of the examples not according to the invention were a low ultimate elongation and a high creep.

A particular advantage when using the films according to the invention is the combination of very good mechanical properties, such as high ultimate elongation, low modulus, low permanent elongation, low creep and high dielectric constant, with, at the same time, a very high breakthrough field strength in the state without elongation. Using these polymer elements according to the invention, particularly advantageous properties of the electromechanical converters produced therewith can advantageously be achieved.

The foregoing examples of the present invention are offered for the purpose of illustration and not limitation. It will be apparent to those skilled in the art that the embodiments described herein may be modified or revised in various ways without departing from the spirit and scope of the invention. the scope of the invention is to be measured by the appended claims.

What is claimed is:

1. An electromechanical converter having at least two electrodes and at least one electroactive polymer element, wherein the polymer element is arranged between two electrodes,
   and wherein the polymer element comprises the reaction product of
   A) a polyisocyanate
   B) a polyisocyanate prepolymer and
   C) a compound having at least two isocyanate-reactive hydroxy groups.

2. The electromechanical converter according to claim 1, wherein the converter comprises one or more selected from the group consisting of a sensor, an actuator and a generator.

3. The electromechanical converter according to claim 1, where in component
   A) comprises a polyisocyanate containing isocyanurate groups or uretdione groups, or a mixture thereof.

4. The electromechanical converter according to claim 1, where in component
   A) comprises a diisocyanate having an NCO functionality ≥2 and having a uretdione, isocyanurate, biuret, iminooxadiazinedione or oxadiazinetrione structure, or a mixture thereof.

5. The electromechanical converter according to claim 1, where in component
   A) comprises a polyisocyanate or a polyisocyanate mixture having a mean NCO functionality of from 2 to 4 containing solely aliphatically or cycloaliphatically bonded isocyanate groups.

6. The electromechanical converter according to claim 1, where in component
   B) comprises a reaction product from the reaction of one or more diisocyanates with one or more hydroxy-functional polyols.

7. The electromechanical converter according to claim 6, where in the diisocyanates are reacted with hydroxy-functional polyols at a ratio of isocyanate groups to hydroxy groups of from 2:1 to 20:1.

8. The electromechanical converter according to claim 1, where in component
   C) comprises a polyamine or a polyol having at least two isocyanate-reactive hydroxy groups.

9. The electromechanical converter according to claim 1, where in component
   C) comprises a polymeric polyol.

10. A process for the preparation of an electromechanical converter according to claim 1, said process comprising:
  a) preparing at least two electrodes;
  b) preparing a polymer element by reaction of a reaction mixture comprising the following components
    A) a polyisocyanate
    B) a polyisocyanate prepolymer and
    C) a compound having at least two isocyanate-reactive hydroxy groups;
  and
  c) arranging the polymer element between two electrodes.

11. The process according to claim 10, where in preparation of the polymer element is carried out by application of the reaction mixture to at least one of the electrodes and reaction of the reaction mixture.

12. The process according to claim 10, where in the reaction mixture of A), B) and C) is dried and/or tempered.

13. The process according to claim 11, where in the equivalent ratio of the isocyanate groups from A) to the isocyanate groups from B) is from 1:10 to 10:1.

14. An electroactive polymer element, produced from a reaction mixture comprising:
  A) a polyisocyanate;
  B) a polyisocyanate prepolymer obtainable from the reaction of one or more diisocyanates with one or more hydroxy-functional polyols; and
  C) a compound having at least two isocyanate-reactive hydroxy groups,
    as wherein the electroactive polymer element comprises an electromechanical element.

15. One of an electronic and an electrical device comprising an electromechanical converter according to claim 1.

16. One of an electronic and an electrical device comprising an electromechanical converter produced according to the process of claim 10.

* * * * *